(12) United States Patent
Kamata et al.

(10) Patent No.: US 7,116,961 B2
(45) Date of Patent: Oct. 3, 2006

(54) IMAGE REJECTION QUADRATIC FILTER (75) Inventors: Takatsugu Kamata, Kanagawa (JP); Kimitake Utsunomiya, Sunnyvale, CA (US)

(73) Assignee: RfStream Corporation, Osaka (JP)

( * ) Notice: Subject to any disclaimer, the term of this patent is extended or adjusted under 35 U.S.C. 154(b) by 105 days.

(21) Appl. No.: 10/448,740

(22) Filed: May 29, 2003
(Under 37 CFR 1.47)

(65) Prior Publication Data
US 2005/0143039 A1    Jun. 30, 2005

Related U.S. Application Data (60) Provisional application No. 60/384,283, filed on May 29, 2002.

(51) Int. Cl.
H04B 1/10    (2006.01)
H04B 1/18    (2006.01)

(52) U.S. Cl. ............. 455/296; 455/285; 455/302; 375/350

(58) Field of Classification Search ........... 455/283, 455/285, 296, 302, 306, 307, 311–312, 337, 455/339; 375/324, 346, 350
See application file for complete search history.

(56) References Cited

U.S. PATENT DOCUMENTS

| | | | |
|---|---|---|---|
| 1,735,742 A | 11/1929 | Fetter | |
| 2,140,770 A | 12/1938 | Schofield | |
| 2,325,174 A | 7/1943 | Cooper | |
| 2,464,557 A | 3/1949 | Crockett | |
| 2,496,177 A | 1/1950 | Richards et al. | |
| 2,531,312 A | 11/1950 | Loon | |
| 2,549,789 A | 4/1951 | Ferrill | |
| 2,796,524 A | 6/1957 | Ferrill | |
| 2,801,341 A | 7/1957 | Jaffe | |
| 3,252,096 A | 5/1966 | Carlson | |
| 3,400,345 A | 9/1968 | Oloff | |
| 3,488,595 A | 1/1970 | Vasile | |
| 3,509,500 A | 4/1970 | McNair et al. | |
| 3,544,903 A | 12/1970 | Sakamoto | |
| 3,686,575 A | 8/1972 | Chamberlain | |
| 3,794,941 A | 2/1974 | Templin | |
| 3,931,578 A | 1/1976 | Gittinger | |
| 4,112,378 A | 9/1978 | Ito et al. | |
| 4,118,679 A | 10/1978 | Hiday et al. | |
| 4,138,654 A | 2/1979 | Luhowy | |
| 4,296,391 A | 10/1981 | Hazama et al. | |
| 4,379,271 A | 4/1983 | Lehmann | |
| 4,456,895 A | 6/1984 | Landt et al. | |
| 4,514,763 A | 4/1985 | Rindal | |
| 4,555,809 A | 11/1985 | Carlson | |

(Continued)

FOREIGN PATENT DOCUMENTS

EP    0 392 449 A1    10/1990

(Continued)

Primary Examiner—Simon Nguyen
(74) Attorney, Agent, or Firm—Stattler Johnson & Adeli LLP (57) ABSTRACT

An image rejection quadratic filter is tunable to filter image frequencies over a wide band. In one embodiment, the image rejection filter includes in-phase and quadrature phase mixers. The image rejection has a fractional transfer function. The image rejection filter has two sub-circuits, wherein the first sub-circuit produces the imaginary component of the transfer function, and the second sub-circuit produces the real component of the transfer function. The first sub-circuit receives the Q signal, and the second sub-circuit receives the I signal. In one embodiment, to create the fractional transfer function, a multi-feedback looped integrator is used.

16 Claims, 8 Drawing Sheets

U.S. PATENT DOCUMENTS

| | | | |
|---|---|---|---|
| 4,598,423 A | 7/1986 | Hettiger |
| 4,785,253 A | 11/1988 | Hughes |
| 4,789,897 A | 12/1988 | Kappeler et al. |
| 4,812,851 A | 3/1989 | Giubardo |
| 4,818,903 A | 4/1989 | Kawano |
| 4,882,614 A | 11/1989 | Kageyama et al. |
| 4,970,479 A | 11/1990 | Landt et al. |
| 4,985,769 A | 1/1991 | Yasumoto et al. |
| 4,988,902 A | 1/1991 | Dingwall |
| 5,077,542 A | 12/1991 | Lanoiselee |
| 5,122,868 A | 6/1992 | Isnardi |
| 5,146,337 A | 9/1992 | Grubbs |
| 5,146,338 A | 9/1992 | Lehmann et al. |
| 5,148,280 A | 9/1992 | Wignot et al. |
| 5,155,580 A | 10/1992 | Gibson et al. |
| 5,187,445 A | 2/1993 | Jackson |
| 5,287,180 A | 2/1994 | White |
| 5,386,239 A | 1/1995 | Wang et al. |
| 5,491,715 A | 2/1996 | Flaxl |
| 5,519,265 A | 5/1996 | Latham |
| 5,525,940 A | 6/1996 | Heikkila et al. |
| 5,663,773 A | 9/1997 | Goeckler |
| 5,737,035 A | 4/1998 | Rotzoll |
| 5,898,900 A | 4/1999 | Richter et al. |
| 5,905,398 A | 5/1999 | Todsen et al. |
| 5,914,633 A | 6/1999 | Comino et al. |
| 6,016,170 A | 1/2000 | Takayama et al. |
| 6,094,236 A | 7/2000 | Abe et al. |
| 6,169,569 B1 | 1/2001 | Widmer et al. |
| 6,177,964 B1 | 1/2001 | Birleson et al. |
| 6,212,540 B1* | 4/2001 | Murakami et al. | 708/819 |
| 6,219,376 B1* | 4/2001 | Zhodzishsky et al. | 375/148 |
| 6,226,509 B1 | 5/2001 | Mole et al. |
| 6,243,567 B1 | 6/2001 | Saito |
| 6,256,495 B1 | 7/2001 | Francisco et al. |
| 6,275,113 B1 | 8/2001 | Nakano et al. |
| 6,307,443 B1 | 10/2001 | Gabara |
| 6,324,233 B1 | 11/2001 | Sempel et al. |
| 6,351,293 B1 | 2/2002 | Perlow |
| 6,359,940 B1 | 3/2002 | Ciccarelli et al. |
| 6,377,315 B1 | 4/2002 | Carr et al. |
| 6,424,206 B1 | 7/2002 | Takahashi et al. |
| 6,424,209 B1 | 7/2002 | Gorecki et al. |
| 6,470,055 B1 | 10/2002 | Feyer |
| 6,535,075 B1 | 3/2003 | Frech et al. |
| 6,535,722 B1 | 3/2003 | Rosen et al. |
| 6,538,521 B1 | 3/2003 | Kobayashi et al. |
| 6,593,828 B1 | 7/2003 | Helfenstein et al. |
| 6,597,748 B1* | 7/2003 | Hietala et al. | 375/324 |
| 6,628,728 B1 | 9/2003 | McCarty, Jr. |
| 6,631,256 B1* | 10/2003 | Suominen | 455/302 |
| 6,636,085 B1* | 10/2003 | Okazaki et al. | 327/101 |
| 6,657,678 B1 | 12/2003 | Mizukami et al. |
| 6,667,649 B1* | 12/2003 | Lee | 327/359 |
| 6,725,463 B1 | 4/2004 | Birleson |
| 6,750,734 B1 | 6/2004 | Utsunomiya et al. |
| 6,778,022 B1 | 8/2004 | Zhang et al. |
| 6,778,594 B1* | 8/2004 | Liu | 375/222 |
| 6,882,245 B1 | 4/2005 | Utsunomiya et al. |
| 6,940,365 B1 | 9/2005 | Kamata et al. |
| 2002/0050861 A1* | 5/2002 | Nguyen et al. | 330/254 |
| 2003/0053562 A1 | 3/2003 | Busson et al. |
| 2003/0097601 A1* | 5/2003 | Glas et al. | 713/401 |
| 2003/0186671 A1* | 10/2003 | Prodanov et al. | 455/339 |
| 2003/0197810 A1 | 10/2003 | Jaffe |

FOREIGN PATENT DOCUMENTS

| | | |
|---|---|---|
| EP | 0 676 880 A2 | 10/1995 |
| EP | 0707379 A1 | 4/1996 |
| WO | WO 95 22839 A2 | 8/1995 |
| WO | WO 01 06637 | 1/2001 |
| WO | WO 0128310 A2 | 4/2001 |

* cited by examiner

IMAGE REJECTION QUADRATIC FILTER

CROSS-REFERENCES TO RELATED APPLICATIONS

This application claims the benefit of U.S. Provisional Patent Application No. 60/384,283, filed May 29, 2002, entitled "Image Rejection Quadratic Filter."

BACKGROUND OF THE INVENTION

1. Field of the Invention

The present invention is directed toward the field of filters, and more particularly toward image rejection notch filters.

2. Art Background

Typically, receivers employ filters to condition both input signals and internally generated reference signals. For example, bandpass, notch, and low pass are types of filters employed in receivers. The frequency response of a filter refers to the characteristics of the filter that condition the signal input to the filter. For example, a bandpass filter may attenuate an input signal across a pre-determined band of frequencies above and below a center frequency of the filter. Filters are designed to exhibit frequency responses based on one or more circuit parameters.

Some receivers are designed to process input signals with a range of input carrier frequencies (e.g., wide band receivers). For example, television receivers must be capable of processing input television signals with carrier frequencies ranging from 55 MHz to 880 MHz. One circuit parameter used to define the frequency response of a filter is the carrier frequency of an input signal.

Figure 1:
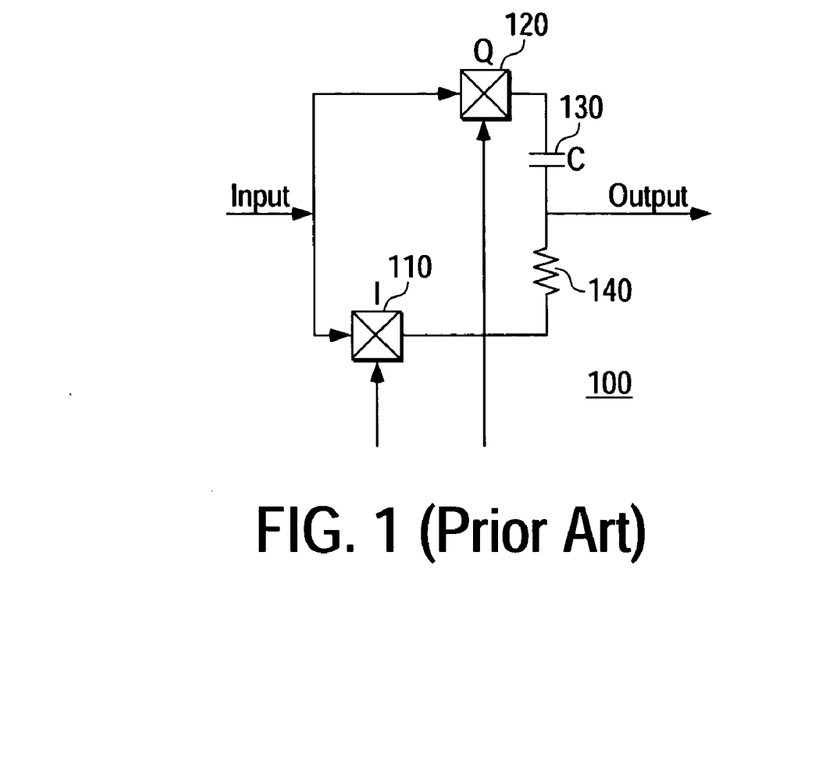
FIG. 1 illustrates one embodiment for an image rejection mixer, including a resistive-capacitive ("RC") filter output.

FIG. 1 illustrates one embodiment for an image rejection mixer, including a resistive-capacitive ("RC") filter output. As shown in FIG. 1, a signal is input (e.g., RF input) to the in-phase ("I") mixer 110 and the quadrature phase ("Q") mixer 120. Also input to the ("I") mixer 110 and quadrature phase ("Q") mixer 120, at the local oscillator ("LO") port, is a local oscillator signal.

As shown in FIG. 1, the I and Q signals are input to the resistor 140 and capacitor 130, respectively. The transfer function of the RC filter may be expressed as:

$$A = \frac{1 + (-j) \times S}{1 + S} = \frac{(1 + Z)}{(1 + S)}$$

where, $$S = jwCr$$

$$S = j \times Z = j \times W / Wo$$

Figure 2:
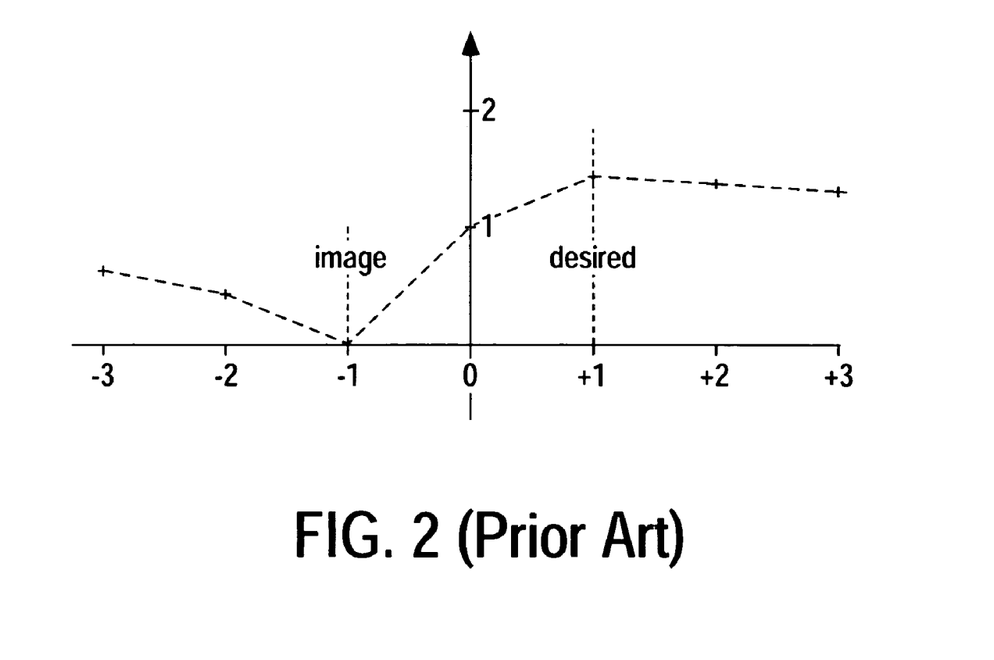
FIG. 2 illustrates a frequency response for the prior art image rejection mixer of FIG. 1.

FIG. 2 illustrates a frequency response for the prior art image rejection mixer of FIG. 1. The frequency response of FIG. 2 is normalized. The image frequency, at −1, is attenuated and the desired frequency range is part of the passband of the filter. The transfer function, for the normalized response, may be expressed as:

$$\frac{(1 + X)}{\sqrt{1 + X^2}}$$

Conventionally an image rejection mixer applies a single notch in the baseband after demodulation. When the desired signal has a relatively wide bandwidth, the image rejecting single notch can remove only one image frequency point. In other words, the single notch cannot remove a desired band. For this reason, the conventional image rejection mixer requires multiple stages of down conversion.

SUMMARY OF THE INVENTION

An image rejection quadratic filter is tunable to filter image frequencies over a wide band. In one embodiment, the image rejection filter includes in-phase and quadrature phase mixers. The image rejection has a fractional transfer function. The transfer function of the image rejection filter has the following characteristics:

a non-recursive numerator and a recursive denominator;

the numerator and the denominator are polynomial equations;

the numerator includes only real terms and the denominator includes only imaginary terms, or the numerator includes only imaginary terms and the denominator includes only real terms;

the numerator and the denominator have the same sign, so that the numerator can be factorized into factors having more zeros;

the transfer function is a second order polynomial or higher; and the coefficients of the polynomial of the numerator are chosen so that the numerator is factorizable at a real number.

The image rejection filter has two sub-circuits, wherein the first sub-circuit produces the imaginary component of the transfer function, and the second sub-circuit produces the real component of the transfer function. The first sub-circuit receives the Q signal, and the second sub-circuit receives the I signal. In one embodiment, to create the fractional transfer function, a multi-feedback looped integrator is used.

DETAILED DESCRIPTION

The disclosure of U.S. Provisional Patent Application 60/384,283, filed May 29, 2002, entitled "Image Rejection Quadratic Filter" is hereby expressly incorporated herein by reference.

An "image signal" is a product of a mixer. The image signal results from mixing an RF signal with a local oscillator signal. For example, an RF input signal with a fundamental frequency of 880 MHz is mixed with a local oscillator having a frequency of 660 MHz to produce a first harmonic at 220 MHz (RF (880 Mhz)–LO (660 Mhz)=220 Mhz). In turn, this first harmonic, centered around 220 MHz, mixes with the local oscillator frequency of 660 MHz to produce the image at 440 MHz. The image frequencies require suppression for proper operation of the circuit.

In one embodiment, the image signal is suppressed using an image rejection quadratic filter. The image rejection quadratic filter is tuned based on the input channel of the RF signal. In one embodiment, the image rejection quadratic filter is tuned to filter the RF signal among a range of frequencies between 110 Mhz and 440 Mhz (i.e., the band of frequencies for the image frequency). The image rejection quadratic filter attenuates the RF signal at the image frequency. One embodiment for tuning a filter, including an RC filter, is described in U.S. patent application Ser. No. 10/448, 605 entitled "Methods and Apparatus for Tuning Using Successive Approximation", inventor Lance M. Wong, filed currently herewith, and is expressly incorporated herein by reference.

Figure 3:
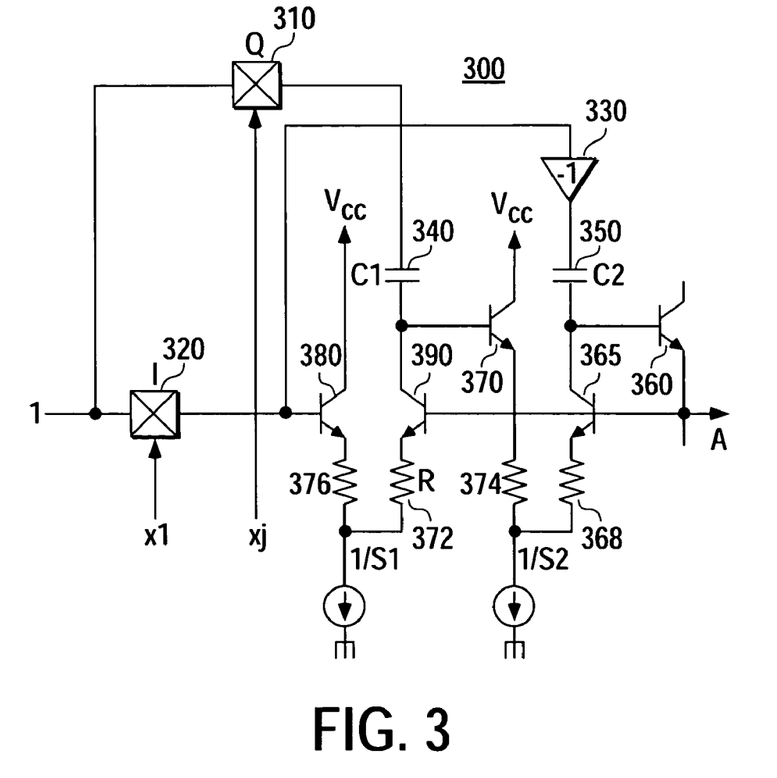
FIG. 3 is a schematic diagram illustrating one embodiment for a second order image rejection mixer.

FIG. 3 is a schematic diagram illustrating one embodiment for a second order image rejection mixer. As shown in FIG. 3, a signal is input (e.g., RF input) to the in-phase ("I") mixer 320 and the quadrature phase ("Q") mixer 310. Also input to the ("I") mixer 320 and quadrature phase ("Q") mixer 310, at the local oscillator ("LO") port, is a local oscillator signal. The local oscillator signal, generated from a emitter, such as a voltage-controlled oscillator, is phase shifted to generate the in-phase and the quadrature phase components of the local oscillator signal. The in-phase and the quadrature phase LO components are input to the in-phase ("I") mixer 320 and the quadrature phase ("Q") mixer 310, respectively. The in-phase ("I") mixer 320 and the quadrature phase ("Q") mixer 310 generate mixed I and Q signals.

For this embodiment, the second order image rejection mixer comprises a plurality of transconductance amplifiers. The transconductance amplifiers consist of transistors (e.g., bipolar transistors) capacitors and resistors. As shown in FIG. 3, the I mixed signal, output from I mixer 320, is input to the base of transistor 380. The emitter of transistor 380 is coupled to resistor 376 of transistor 380. A first transconductance amplifier also includes a second transistor, 390. The emitter of transistor 390 is coupled to resistor 372, and the collector is coupled to capacitor 340. Capacitor 340 has a capacitance of "C1", and capacitor 340 is coupled to receive the output of Q mixer 310.

The capacitor 340 also couples the output of Q mixer 310 to the input to a second transconductance amplifier (i.e., input to the base of transistor 370). The second transconductance amplifier generates the imaginary component of the transfer function. The second transconductance amplifier contains transistors 370 and 365, and resistors 368 and 374. The output of the I mixer 320 is inverted in inventor 330 for subsequent input to capacitor 350. Capacitor 350 has a value set to "C2." Transistor 360 receives, at its base, the output of capacitor 350. The circuit 300 is biased with current sources as shown in FIG. 3. The output of the image rejection mixer 300 is labeled as "A" on FIG. 3.

The second order image rejection filter 300 of FIG. 3 has a transfer function as follows:

$$A = \frac{1 + j \times S1 \times S2}{1 + S1 + S1 \times S2}$$
$$= \frac{(1 + Za) \times (1 + Zb)}{(1 + Sa) \times (1 + Sb)}$$

where, $$S1 = jwC1R$$

$$S2 = jwC2R$$

The numerator of the transfer function is real number, whereas the denominator of the transfer function is a complex number. Also:

$$1+S1+S1 \times S2 = (1+Sa) \times (1+Sb)$$

$$Sa = j \times Za = j \times W/Wa$$

$$Sb = j \times Zb = j \times W/Wb$$

The capacitor value C1 corresponds to capacitor 340 (FIG. 3), and capacitor value C2 corresponds to capacitor 340. The resistor value, R, is the value for resistors 376, 372, 374, and 368.

Figure 4:
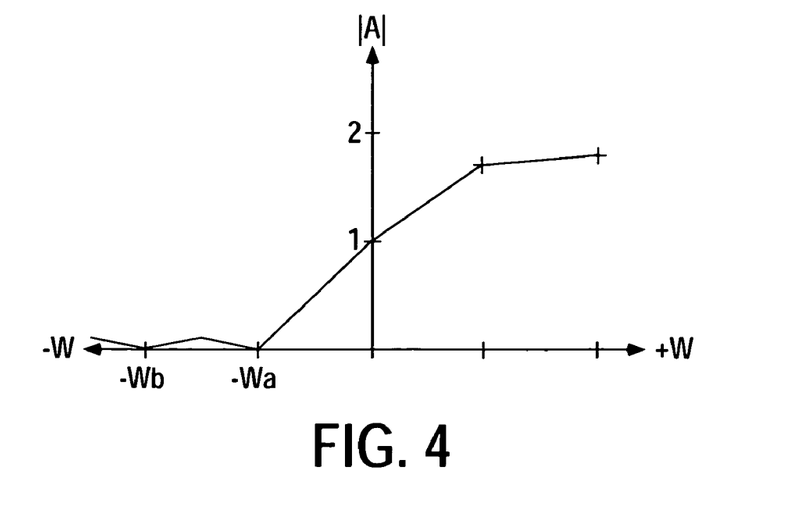
FIG. 4 illustrates one embodiment for a second order image rejection filter that has a split pole.

FIG. 4 illustrates one embodiment for a second order image rejection filter that has a split pole. A normalized transfer function for this embodiment is as follows:

$$\frac{(1+X)(1+0.25X)}{\sqrt{1+X^2}\sqrt{1+(0.25X)^2}}$$

For this embodiment, the capacitor value, C1, which corresponds to capacitor 340 (FIG. 3), has a value of 1.25 Co, and capacitor value C2, which corresponds to capacitor 340, has a value of 0.2 Co. The value, Co, corresponds to the value of "C" to normalize the image at "−1."

Figure 5:
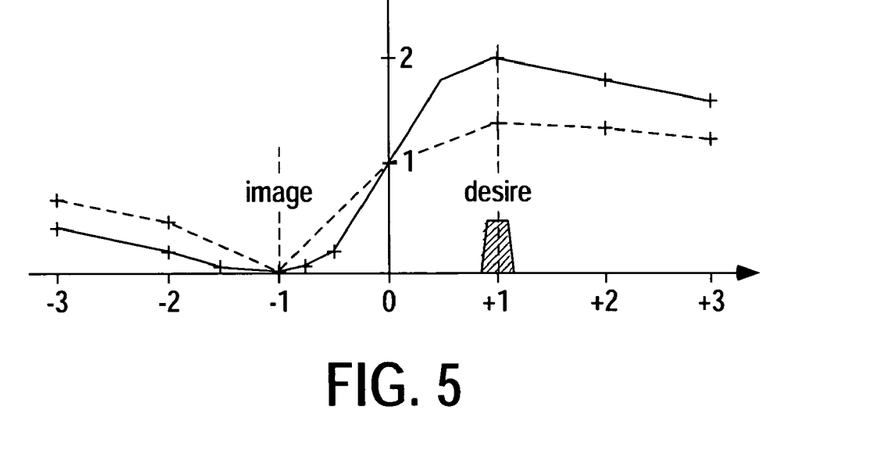
FIG. 5 illustrates another embodiment for a second order image rejection filter that has the same two poles.

FIG. 5 illustrates another embodiment for a second order image rejection filter that has the same two poles. As shown in FIG. 5, a desired band of frequencies (e.g., television channel) is centered around "+1", and the image from the I,Q mixers is centered around "−1." For this embodiment, the normalized transfer function for this embodiment is as follows:

$$\frac{(1+X)^2}{1+X^2}$$

For this embodiment, the capacitor value, C1, has a value of 2 Co, and capacitor value, C2, has a value of 0.5 Co.

Figure 6:
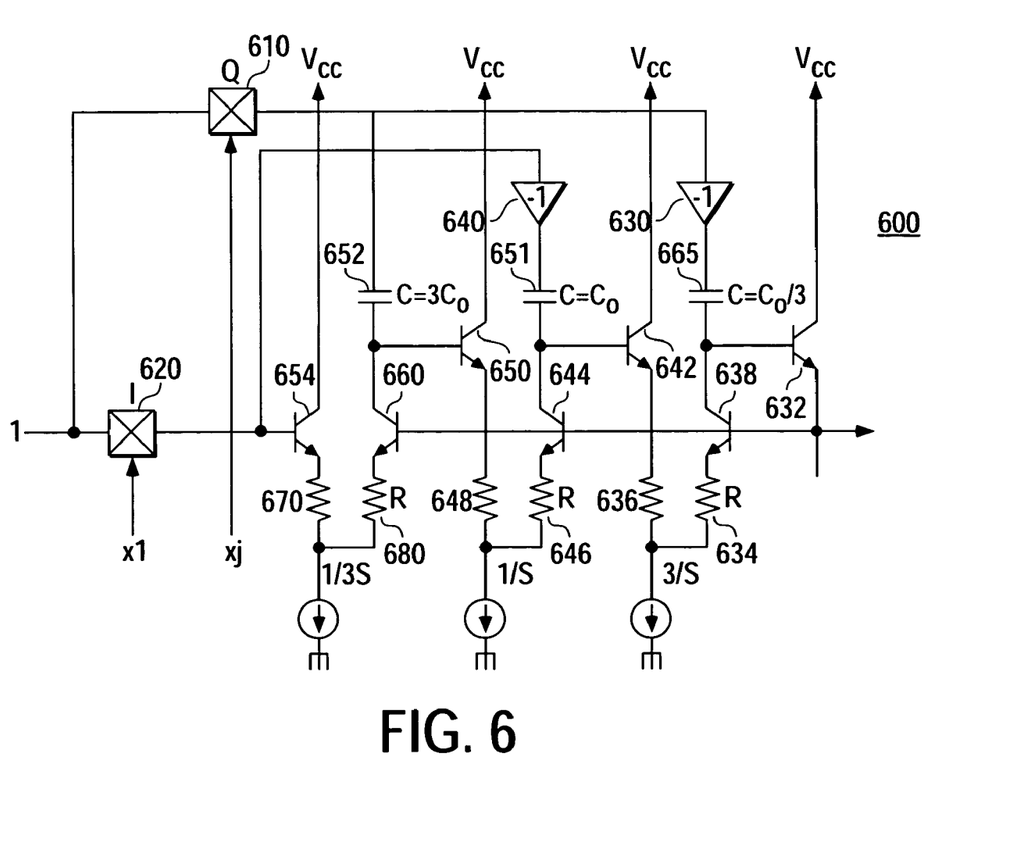
FIG. 6 is a schematic diagram illustrating one embodiment for a third order image rejection mixer.

FIG. 6 is a schematic diagram illustrating one embodiment for a third order image rejection mixer. As shown in FIG. 6, a signal is input to an in-phase ("I") mixer 620 and quadrature phase ("Q") mixer 610. A local oscillator signal is also input to the ("I") mixer 620 and quadrature phase ("Q") mixer 610, at the local oscillator ("LO") ports. The local oscillator signal is phase shifted to generate the in-phase and the quadrature phase components (e.g., x1 and xj)

of the local oscillator signal. The I mixer 620 and Q mixer 610 generate mixed I and Q signals.

For this embodiment, the third order image rejection mixer comprises multiple cascaded transconductance amplifiers. As shown in FIG. 6, the I mixed signal, output from I mixer 620, is input to a first transconductance amplifier. Specifically, the I mixed signal is input to the base of transistor 654, and the emitter of transistor 654 is coupled to resistor 670. The emitter of transistor 660 is coupled to resistor 680, and the collector is coupled to capacitor 652. The capacitance of capacitor 652 has value of "3 Co." Capacitor 652 is coupled to receive the output of Q mixer 610.

The capacitor 652 also couples the output of Q mixer 610 to the input of a second transconductance amplifier (i.e., input to the base of transistor 650). The second transconductance amplifier provides an imaginary component to the transfer function. The second transconductance amplifier consists of transistors 650 and 644, resistors 646 and 648, and capacitor 651. The output of I mixer 620 is inverted in inventor 640 for subsequent input to capacitor 651. Capacitor 651 has a value set to "Co."

The third order image rejection mixer also comprises a third transconductance ($g_m$) amplifier. The third transconductance amplifier also provides an imaginary component to the transfer function. For this embodiment, the third transconductance amplifier consists of transistors 642 and 638, resistors 634 and 636, and capacitor 665. Capacitor 665 has a value set to "Co/3." The output of Q mixer 610 is inverted in inventor 630 for subsequent input to capacitor 665. The emitter of transistor 638 is coupled to resistor 634, and the collector is coupled to capacitor 665. Transistor 632 receives, at its base, the output of capacitor 665. The output of the image rejection mixer 600 is coupled to the emitter of transistor 632. The output of image rejection mixer 600 drives the bases of transistors 638, 644 and 660. The third order image rejection response circuit 600 is biased using current sources as shown in FIG. 6.

The third order image rejection filter 600 of FIG. 6 has a transfer function as follows:

$$A = \frac{1 + j \times 3S - 3S \times S - j \times 3 1 \times S \times S/3}{1 + 3S + 3S \times S + 3S 1 \times S \times S/3}$$
$$= \frac{(1+Z) \times (1+Z) \times (1+Z)}{(1+S) \times (1+S) \times (1+S)}$$

where, $S = jwCR$

The capacitor value, C, corresponds to the "C" designations in capacitors 652, 651 and 665 (FIG. 6). The resistor value, R, is the value for resistors 670, 680, 648, 636 and 634.

Figure 7:
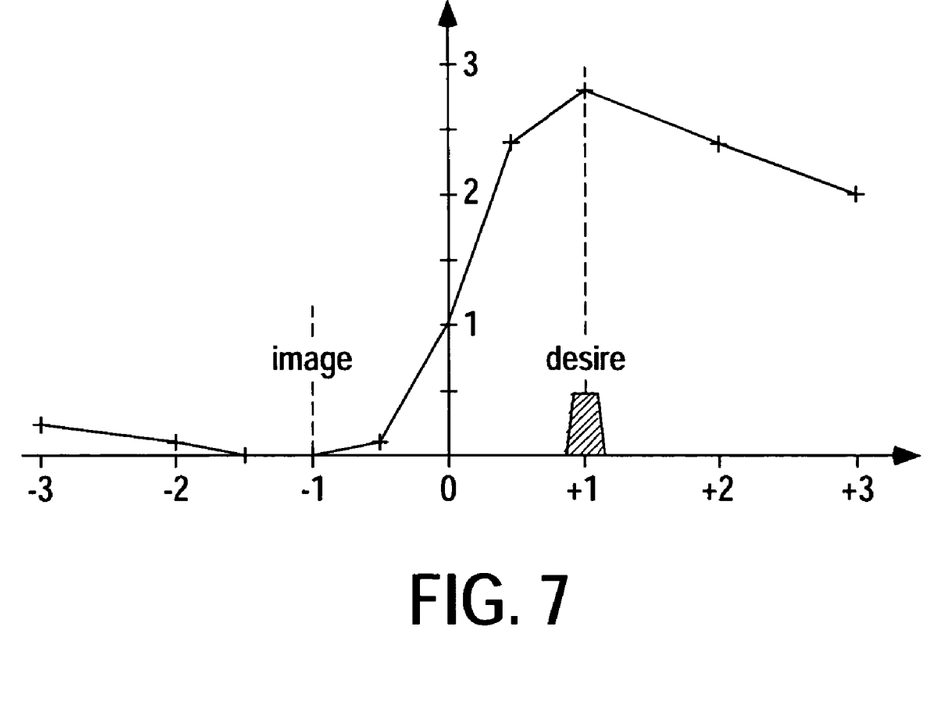
FIG. 7 illustrates one embodiment for a frequency response of a third order image rejection filter.

FIG. 7 illustrates one embodiment for a frequency response of a third order image rejection filter. The frequency response graph of FIG. 7 is normalized. As shown in FIG. 7, a desired band of frequencies for the signal is centered around "+1", and the image from the I,Q mixers is centered around "−1." For this embodiment, the normalized transfer function for this embodiment is as follows:

$$\frac{(1+X)^3}{(1+X^2)^{3/2}}$$

Figure 8:
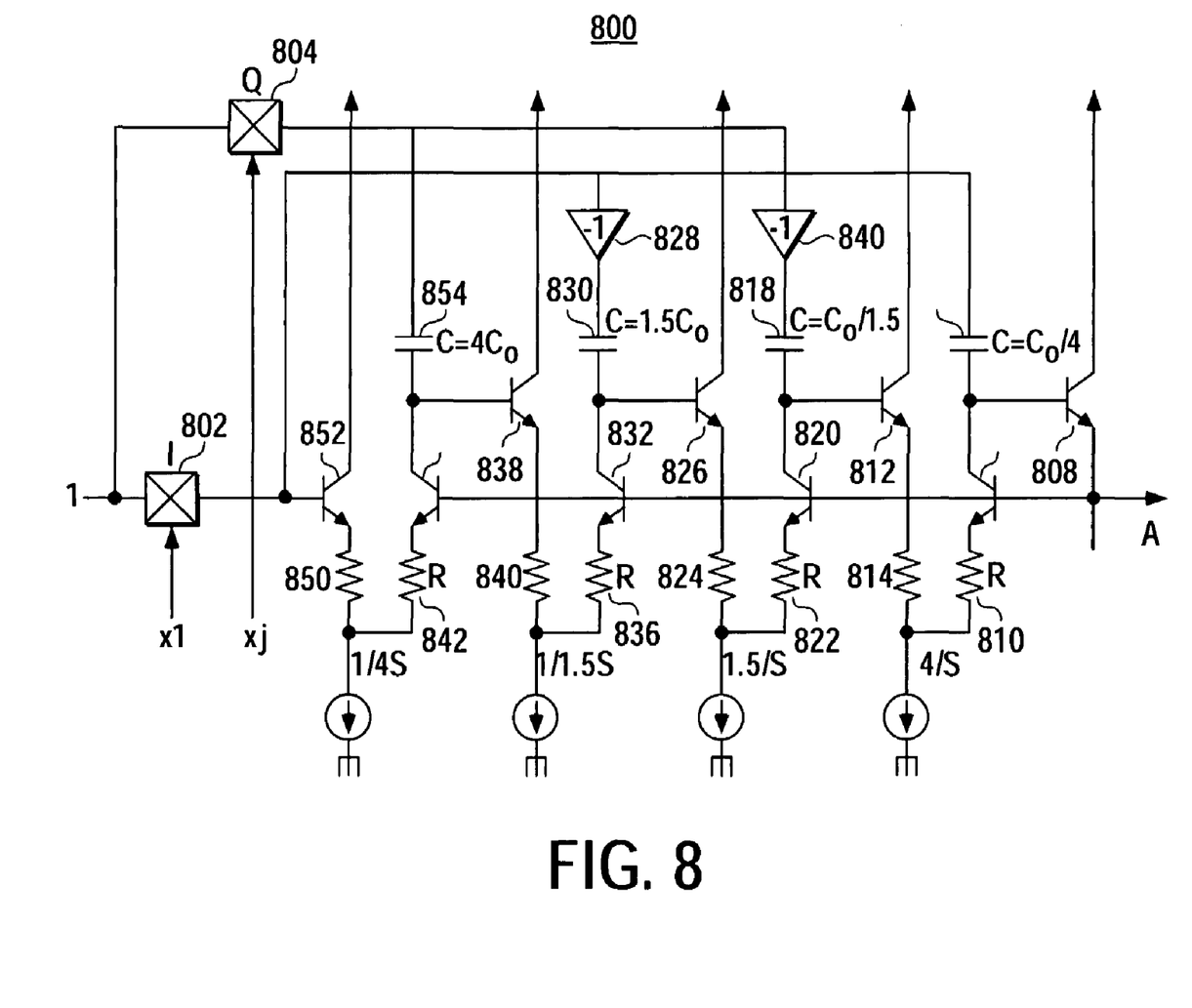
FIG. 8 is a schematic diagram illustrating one embodiment for a fourth order image rejection mixer.

FIG. 8 is a schematic diagram illustrating one embodiment for a fourth order image rejection mixer. An input signal is input to an in-phase ("I") mixer 802 and quadrature phase ("Q") mixer 804. A local oscillator signal is phase shifted to generate in-phase component (x1) and quadrature phase component (xj). The local oscillator signal (x1) is input to I mixer 802, and the local oscillator signal (xj) is input to quadrature phase Q mixer 610 at each respective local oscillator ("LO") ports. The I mixer 620 and Q mixer 610 generate mixed I and Q signals.

For this embodiment, the fourth order image rejection mixer comprises a series of cascaded transconductance amplifiers. As shown in FIG. 8, the I mixed signal, output from I mixer 620, is input to a first transconductance amplifier. The first transconductance amplifier includes transistors 852 and 843. The I mixed signal is input to the base of transistor 852, and the emitter of transistor 852 is coupled to resistor 850. The emitter of transistor 843 is coupled to resistor 842, and the collector is coupled to capacitor 854. The capacitance of capacitor 854 has value of "4 Co." Capacitor 652 is also coupled to receive the output of Q mixer 804.

The capacitor 854 also couples the output of Q mixer 804 to the input of a second transconductance amplifier. The second transconductance amplifier consists of transistors 838 and 832, resistors 840 and 836, and capacitor 830. The output of I mixer 802 is inverted in inventor 828 for subsequent input to capacitor 830. Capacitor 830 has a value set to "1.5 C0."

The fourth order image rejection mixer also comprises a third transconductance ($g_m$) amplifier. For this embodiment, the third transconductance amplifier consists of transistors 826 and 820, resistors 824 and 822, and capacitor 818. The output of Q mixer 804 is inverted in inventor 840 for subsequent input to capacitor 818. The emitter of transistor 826 is coupled to resistor 824. The emitter of transistor 820 is coupled to resistor 822 and the collector is coupled to capacitor 818.

For this embodiment, the fourth order image rejection mixer further comprises a fourth transconductance ($g_m$) amplifier. The fourth transconductance amplifier consists of transistors 812 and 815, resistors 814 and 810, and capacitor 817. Transistor 812 receives, at its base, the output of capacitor 818. The output of I mixer 802 is input to capacitor 817. The emitter of transistor 812 is coupled to resistor 814. The emitter of transistor 815 is coupled to resistor 810 and the collector is coupled to capacitor 817. The output of the image rejection mixer 800 is coupled to the emitter of transistor 808. The output of image rejection mixer 800 drives the bases of transistors 843, 832, 820 and 815.

The fourth order image rejection filter 800 of FIG. 8 has a transfer function as follows:

$$A = \frac{1 + j4S - 4S \times 1.5S - j4S \times 1.5S \times S/1.5 + 4S \times 1.5S \times S/1.5 \times S/4}{1 + 4S + 4S \times 1.5S + 4S \times 1.5S \times S/1.5 + 4S \times 1.5S \times S/1.5 \times S/4}$$
$$= \frac{(1+Z) \times (1+Z) \times (1+Z)(1+Z)}{(1+S) \times (1+S) \times (1+S) \times (1+S)}$$

where, $S = jwCR$

The numerator includes real number terms, and the denominator includes imaginary numbers. The capacitor value, C, corresponds to the "C" designations in capacitors

854, 830, 818 and 817 (FIG. 8). The resistor value, R, is the value for resistors 850, 842, 840, 836, 824, 822, 814 and 810. The fourth order image rejection response circuit 800 is biased with current sources as shown in FIG. 8.

Figure 9:
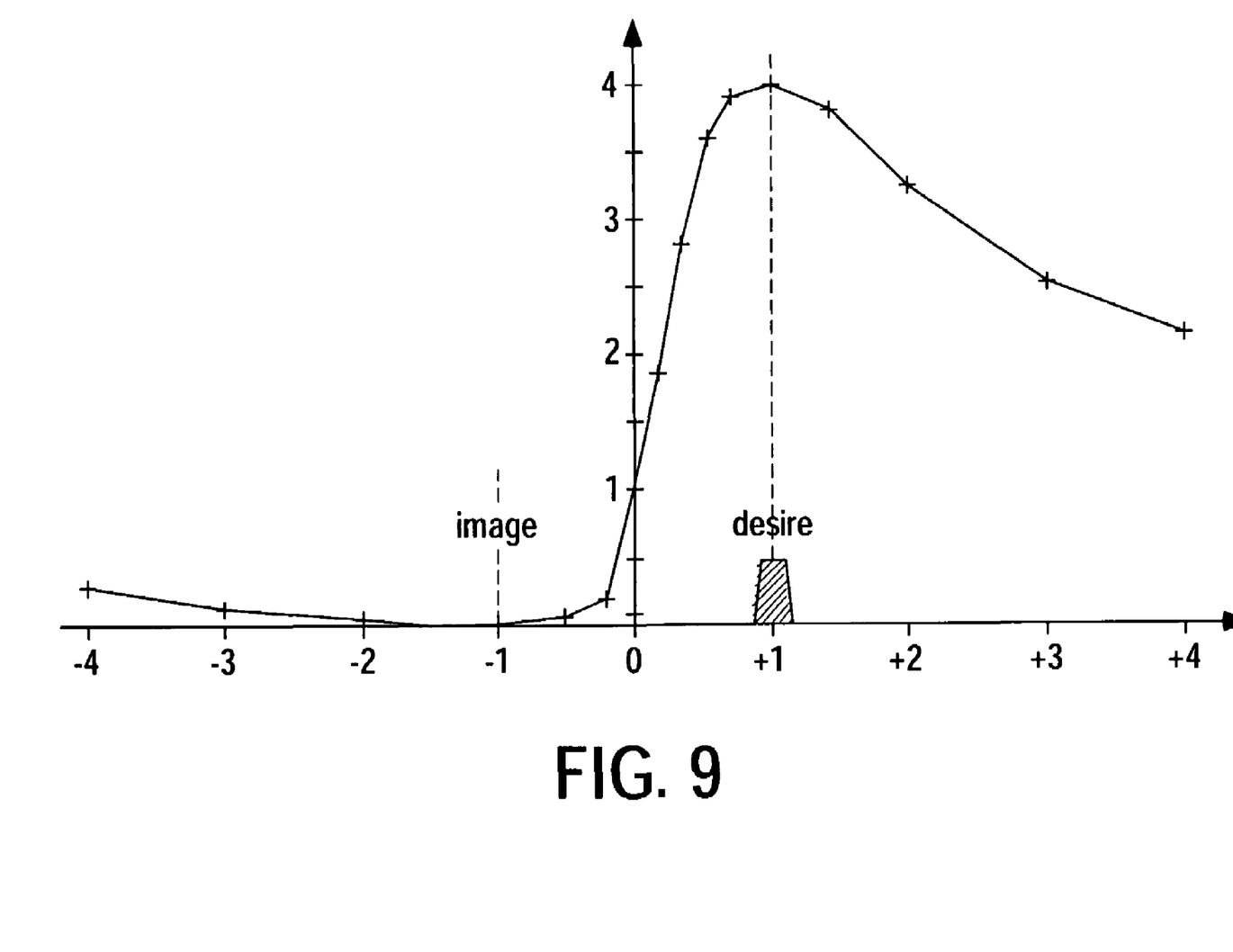
FIG. 9 illustrates one embodiment for a frequency response of a fourth order image rejection filter.

FIG. 9 illustrates one embodiment for a frequency response of a fourth order image rejection filter. The frequency response graph of FIG. 9 is normalized. As shown in FIG. 9, a desired band of frequencies for the signal is centered around "+1", and the image from the I,Q mixers is centered around "−1." For this embodiment, the normalized transfer function for this embodiment is as follows:

$$\frac{(1+X)^4}{(1+X^2)^2}$$

Figure 10:
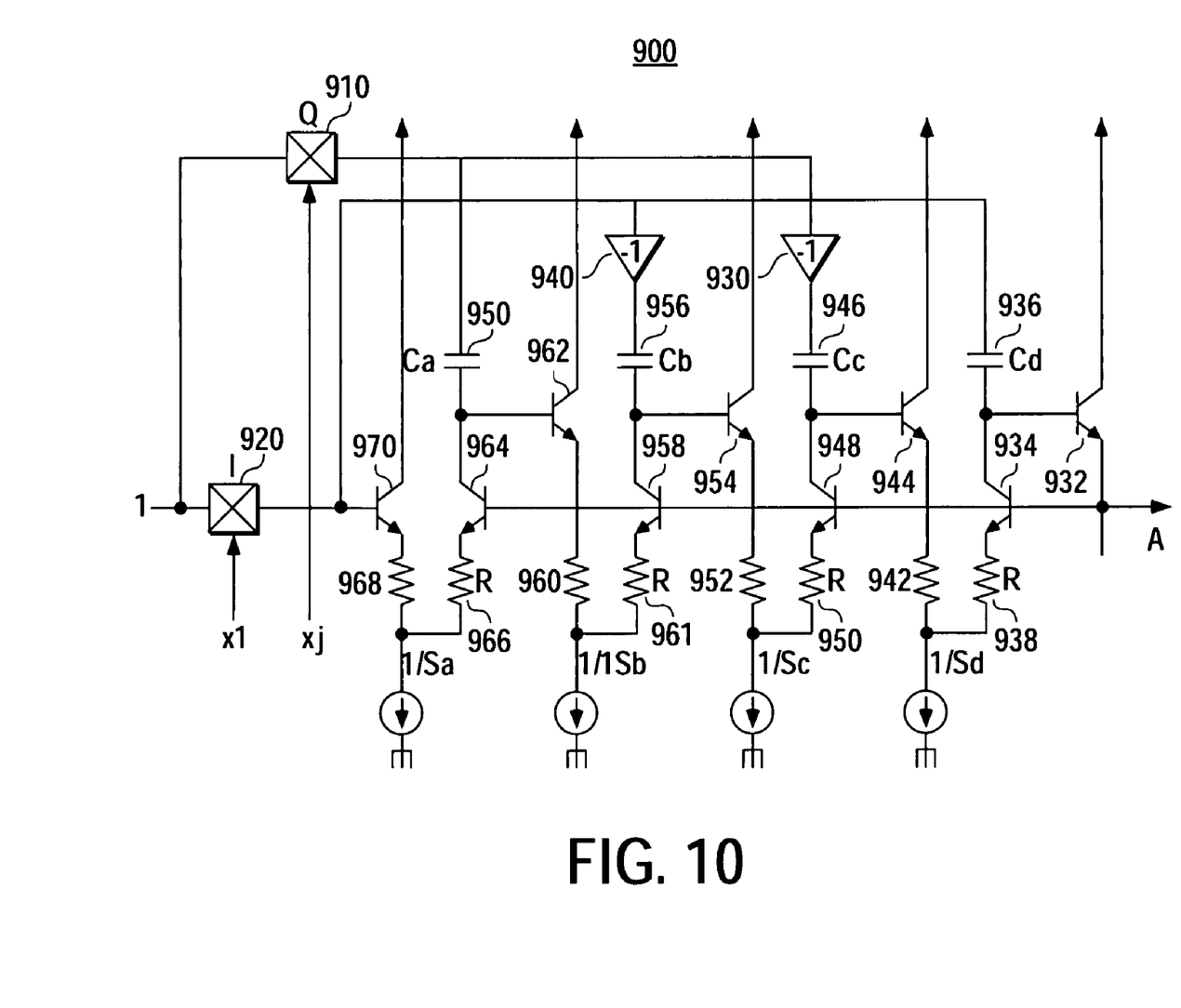
FIG. 10 is a schematic diagram illustrating another embodiment for a fourth order image rejection mixer.

FIG. 10 is a schematic diagram illustrating another embodiment for a fourth order image rejection mixer. Circuit 900 of FIG. 10 is the same as circuit 800 of FIG. 8, except the sub-circuits in circuit 900 are tuned to generate the expressions 1/Sa, 1/1Sb, 1/Sc, and 1/Sd, wherein:

$Sa = jwCaR$ $Sb = jwCbR$ $Sc = jwCcR$ $Sd = jwCdR$

The fourth order image rejection filter 900 of FIG. 10 has a transfer function as follows:

$$A = \frac{1 + j\text{Sa} - \text{Sa} \times \text{Sb} - j\text{Sa} \times \text{Sb} \times \text{Sc} + \text{Sa} \times \text{Sb} \times \text{Sc} \times \text{Sd}}{1 + \text{Sa} + \text{Sa} \times \text{Sb} + \text{Sa} \times \text{Sb} \times \text{Sc} + \text{Sa} \times \text{Sb} \times \text{Sc} \times \text{Sc}}$$

$$= \frac{(1+Z) \times (1+Z) \times (1+0.25Z) \times (1+0.25Z)}{(1+S) \times (1+S) \times (1+0.25S) \times (1+0.25S)}$$

The numerator includes real number terms, and the denominator includes imaginary numbers. The capacitor values Ca, Cb, Cc and Cd correspond to the "Ca", "Cb", "Cc" and "Cd" designations in capacitors 950, 956, 946 and 936 (FIG. 10). The resistor value, R, is the value for resistors 968, 966, 960, 961, 950 and 938.

Figure 11:
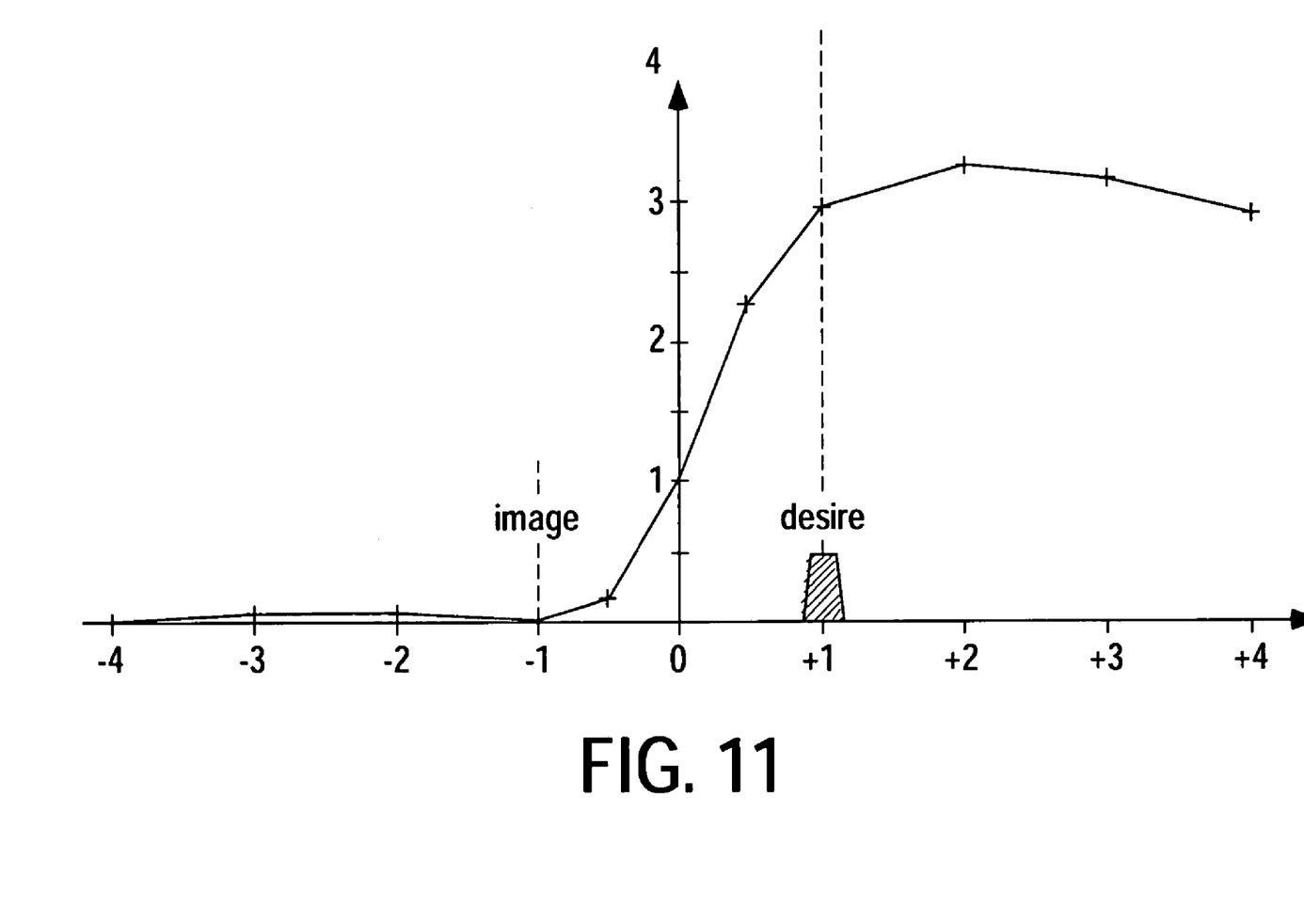
FIG. 11 illustrates one embodiment for a frequency response of the fourth order image rejection filter of FIG. 10.

FIG. 11 illustrates one embodiment for a frequency response of the fourth order image rejection filter of FIG. 10. The frequency response graph of FIG. 11 is normalized. As shown in FIG. 11, a desired band of frequencies for the signal is centered around "+1", and the image from the I,Q mixers is centered around "−1." For this embodiment, the normalized transfer function for this embodiment is as follows:

$$\frac{(1+X)^2(1+X/4)^2}{(1+X)^2(1+X/4^2)}$$

As described herein, the invention achieves wideband image rejection. This allows the IF frequency to be as low as possible. It also deepens the attenuation at the image frequency band.

Although the present invention has been described in terms of specific exemplary embodiments, it will be appreciated that various modifications and alterations might be made by those skilled in the art without departing from the spirit and scope of the invention.

What is claimed is:

1. An image rejection filter comprising a transfer function, said filter comprising:
   first sub-circuit for receiving a quadrature-phase signal for filtering and for generating an imaginary component from said quadrature-phase signal;
   second sub-circuit for receiving an in-phase signal for filtering and for generating a real component from said in-phase signal; and
   wherein a numerator of said transfer function is factorizable into factor terms that are real only and a denominator of said transfer function is factorizable into factor terms that are complex only.

2. The image rejection filter as set forth in claim 1, wherein said filter comprises a multi-feedback looped integrator that creates a fractional transfer function.

3. The image rejection filter as set forth in claim 1, wherein said transfer function further comprising a non-recursive numerator and a recursive denominator.

4. The image rejection filter as set forth in claim 1, wherein said numerator and said denominator comprise polynomial equations.

5. The image rejection filter as set forth in claim 4, wherein coefficients of said polynomial equation of said numerator comprise numbers factorized as real numbers.

6. The image rejection filter as set forth in claim 1, wherein said numerator comprises at least one real number and said denominator comprises at least one imaginary number.

7. The image rejection filter as set forth in claim 1, wherein said numerator comprises at least one imaginary number and said denominator comprises at least one real number.

8. The image rejection filter as set forth in claim 1, wherein said numerator and said denominator of said transfer function comprise the same sign, so as to allow factorization of said numerator into a plurality of factor comprising zeros.

9. The image rejection filter as set forth in claim 1, wherein said image rejection filter comprises a second order image rejection mixer.

10. The image rejection filter as set forth in claim 9, wherein said second order image rejection mixer comprises a transfer function as follows:

$$A = \frac{1 + j \times S1 \times S2}{1 + S1 + S1 \times S2}$$

$$= \frac{(1+Za) \times (1+Zb)}{(1+Sa) \times (1+Sb)}$$

wherein, $S1 = jwC1R$ $S2 = jwC2R$

11. The image rejection filter as set forth in claim 9, wherein said second order image rejection mixer comprises a split pole transfer function.

12. The image rejection filter as set forth in claim 1, wherein said image rejection filter comprises a third order image rejection mixer.

13. The image rejection filter as set forth in claim 12, wherein said third order image rejection mixer comprises a transfer function as follows:

$$A = \frac{1 + j \times 3S - 3S \times S - j \times 3I \times S \times S/3}{1 + 3S + 3S \times S + 3SI \times S \times S/3}$$

$$= \frac{(1+Z) \times (1+Z) \times (1+Z)}{(1+S) \times (1+S) \times (1+S)}$$

wherein, $$S = jwCR$$

14. The image rejection filter as set forth in claim 13, wherein said image rejection filter comprises a fourth order image rejection mixer.

15. The image rejection filter as set forth in claim 14, wherein said fourth order image rejection mixer comprises a transfer function as follows:

$$A = \frac{1 + j4S - 4S \times 1.5S - j4S \times 1.5S \times S/1.5 + 4S \times 1.5S \times S/1.5 \times S/4}{1 + 4S + 4S \times 1.5S + 4S \times 1.5S \times S/1.5 + 4S \times 1.5S \times S/1.5 \times S/4}$$

$$= \frac{(1+Z) \times (1+Z) \times (1+Z)(1+Z)}{(1+S) \times (1+S) \times (1+S) \times (1+S)}$$

wherein, $$S = jwCR$$

16. The image rejection filter as set forth in claim 1, wherein said image rejection filter comprises a plurality of cascaded transconductance amplifiers.

* * * * *